(12) United States Patent
Yamazaki et al.

(10) Patent No.: US 7,820,118 B2
(45) Date of Patent: Oct. 26, 2010

(54) SUBSTRATE PROCESSING APPARATUS HAVING COVERED THERMOCOUPLE FOR ENHANCED TEMPERATURE CONTROL

(75) Inventors: Keishin Yamazaki, Takaoka (JP); Iwao Nakamura, Imizu (JP); Ryota Sasajima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 92 days.

(21) Appl. No.: 11/989,484

(22) PCT Filed: Aug. 4, 2006

(86) PCT No.: PCT/JP2006/315482

§ 371 (c)(1),
(2), (4) Date: May 13, 2008

(87) PCT Pub. No.: WO2007/018142

PCT Pub. Date: Feb. 15, 2007

(65) Prior Publication Data

US 2009/0111285 A1    Apr. 30, 2009

(30) Foreign Application Priority Data

Aug. 9, 2005    (JP) .............................. 2005-230737

(51) Int. Cl.
*H01L 21/26* (2006.01)
*B01J 19/00* (2006.01)

(52) U.S. Cl. ................. 422/198; 438/795; 257/E21.328
(58) Field of Classification Search ................. 438/795; 422/198; 257/E21.328

See application file for complete search history.

(56) References Cited

FOREIGN PATENT DOCUMENTS

| JP | A-01-239842 | 9/1989 |
|---|---|---|
| JP | A-07-263369 | 10/1995 |
| JP | A-08-210923 | 8/1996 |
| JP | A-11-064115 | 3/1999 |
| JP | A-11-260725 | 9/1999 |
| JP | A-2000-031062 | 1/2000 |
| JP | A-2000-150404 | 5/2000 |
| JP | A-2005-209754 | 8/2005 |

*Primary Examiner*—Hsien-ming Lee
*Assistant Examiner*—Walter H Swanson
(74) *Attorney, Agent, or Firm*—Oliff & Berridge, PLC (57) ABSTRACT

To provide a substrate treatment apparatus capable of performing temperature control in a reaction tube with accuracy.

A substrate treatment apparatus 100 includes: a reaction tube 42 for treating a substrate 54; a heater 46 for heating the substrate 54 in the reaction tube 42; a cooling air channel 72 for circulating cooling air 70 outside the reaction tube 42; and a thermocouple 82 for detecting temperature around the reaction tube 42. The thermocouple 82 is disposed in the cooling air channel 72 for circulating cooling air 70 in a state where the thermocouple 82 is covered with a protection tube 86, and a cover 88 for intercepting flow toward the protection tube 86 of the cooling air 70 is disposed outside the protection tube 86.

11 Claims, 7 Drawing Sheets

SUBSTRATE PROCESSING APPARATUS HAVING COVERED THERMOCOUPLE FOR ENHANCED TEMPERATURE CONTROL

TECHNICAL FIELD

The present invention relates to a substrate treatment apparatus for treating a semiconductor wafer, a glass substrate, and the like, and a method for manufacturing a substrate or a method for manufacturing a semiconductor device, both of the methods having a process for treating a substrate by using the apparatus.

BACKGROUND ART

A vertical heat treatment apparatus has been widely known as a substrate treatment apparatus for treating a substrate. In a substrate treatment apparatus of this type, there has been publicly known, for example, a substrate treatment apparatus that detects temperature by a thermocouple disposed in a heating area and controls the temperature of a heater on the basis of the detection output of the thermocouple and keeps temperature in the heating area uniformly (for example, patent document 1)

Patent document 1: JP-A-11-260725

DISCLOSURE OF THE INVENTION

Problems that the Invention is to Solve

However, there is presented a problem that when the treatment of forcibly cooling a heating zone to lower temperature in a reaction space, that is, when a rapid cooling treatment is performed, temperature control cannot be performed with accuracy.

It can be thought that this is caused by the fact that because the interior of a reaction container (reaction tube) is cooled by producing the flow of cooling air outside the reaction container by the use of a blower in the rapid cooling treatment, a thermocouple having a smaller heat capacity than the reaction container receives the flow of cooling air and hence is cooled faster than the interior of the reaction container to cause a difference between actual temperature in the reaction container and temperature measured by the thermocouple.

Moreover, the thermocouple happens to have its root portion or barrel portion broken by contact with other part or an external stress caused by thermal expansion of the thermocouple or the like.

The object of the present invention is to provide a substrate treatment apparatus capable of solving the above-mentioned problems in the related art and performing temperature control in a reaction tube with accuracy, a method for manufacturing a substrate, and a method for manufacturing a semiconductor device.

Means for Solving the Problems

A first feature of the present invention consists in a substrate treatment apparatus including: a reaction tube for treating a substrate; a heater for heating the substrate in the reaction tube; a channel for circulating cooling fluid outside the reaction tube; and a thermocouple for detecting temperature around the reaction tube, wherein the thermocouple is disposed in the channel for circulating cooling fluid in a state where the thermocouple is covered with a protection tube, and wherein a cover for intercepting flow of the cooling fluid toward the protection tube is disposed outside the protection tube.

Preferably, the cover has an opening formed in its tip end and is disposed in such a way that the opening is opposite to an outside surface of the reaction tube. Preferably, a tip end of the protection tube where a temperature measuring contact point of the thermocouple is located is exposed in the opening, and the protection tube is disposed in such a way that its exposed tip end is opposite to the outside surface of the reaction tube. Preferably, the cooling fluid is constructed so as to flow in parallel to the outside surface of the reaction tube.

Preferably, the protection tube is disposed in such a way that its tube axis is at a right angle to the flow of the cooling fluid. Preferably, the protection tube is disposed in such a way that its tube axis is at a right angle to the tube axis of the reaction tube. Preferably, the protection tube is disposed in such a way that its tube axis is horizontal. Preferably, a space is formed between the protection tube and the cover. Preferably, the cover is constructed so as to cover at least a part of side of the protection tube. Preferably, the cover is constructed so as to cover whole of side of the protection tube.

Moreover, preferably, a tip end of the cover is closed. Preferably, the cover is made of alumina, zirconia, or silicon carbide.

A second feature of the present invention consists in a method for manufacturing a substrate comprising the steps of: carrying a substrate into a reaction tube; heating the substrate in the reaction tube to treat the substrate; lowering temperature in the reaction tube after processing the substrate while circulating cooling fluid outside the reaction tube and detecting temperature around the reaction tube by a thermocouple disposed in a channel for circulating the cooling fluid and covered with a protection tube; and carrying the treared substrate out of the reaction tube, wherein in the step of lowering temperature in the reaction tube, the temperature around the reaction tube is detected in a state where flow of the cooling fluid toward the protection tube is intercepted.

A third feature of the present invention consists in a method for manufacturing a semiconductor device comprising the steps of: carrying a substrate into a reaction tube; heating the substrate in the reaction tube to treat the substrate; lowering temperature in the reaction tube after processing the substrate while circulating cooling fluid outside the reaction tube and detecting temperature around the reaction tube by a thermocouple disposed in a channel for circulating the cooling fluid and covered with a protection tube; and carrying the treated substrate out of the reaction tube, wherein in the step of lowering temperature in the reaction tube, the temperature around the reaction tube is detected in a state where flow of the cooling fluid toward the protection tube is intercepted.

ADVANTAGE OF THE INVENTION

According to the present invention, it is possible to reduce the effect of the cooling fluid and to perform temperature control in the reaction tube with accuracy by disposing the cover outside the protection tube so as to intercept flow toward the protection tube of the cooling fluid.

BRIEF DESCRIPTION OF THE DRAWINGS

FIG. 3(a) is a sectional view showing the arrangement of a reaction tube, the thermocouple, and a heater. FIG. 3(b) is a sectional view showing the tip end of the cover member (tip opening type). FIG. 3(c) is a sectional view showing the tip end of the cover member (tip closing type).

FIGS. 6(a) to 6(c) are sectional views of a cover member in the first modification. FIGS. 6(d) to 6(h) are sectional views of a cover member in the second modification.

FIGS. 7(a) and 7(b) are sectional views showing an opening of the cover member.

DESCRIPTION OF REFERENCE SYMBOLS 10 substrate treatment apparatus
12 box
14 pod stage
16 pod
18 pod transport unit
20 pod shelf
22 pod opener
24 number-of-substrates detector
26 substrate transfer unit
28 notch aligner
30 substrate support jig (boat)
32 arm (tweezers)
40 reaction furnace
42 reaction tube
43 reaction container
44 adapter
46 heater
46a heater wire
46b thermal insulating material
46c cooling air intake port
48 furnace mouth seal cap
50 second heat insulating material
52 first heat insulating material
54 substrate
56 gas supply port
57 main part
58 gas exhaust port
59 gas exhaust port
60 gas introduction tube
62 exhaust tube
64 gas introduction passage
66 nozzle
70 cooling air
72 cooling air channel
74 exhaust port
76 exhaust passage
78 radiator
80 blower
82 thermocouple
84 control unit
86 protection tube
88 cover member
90 opening
92 hole
94 root portion
96 first collar portion
98 second collar portion
100 fixture
102 fixing plate

BEST MODE FOR CARRYING OUT THE INVENTION

Next, the embodiments of the present invention will be described with reference to the drawings.

Figure 1:
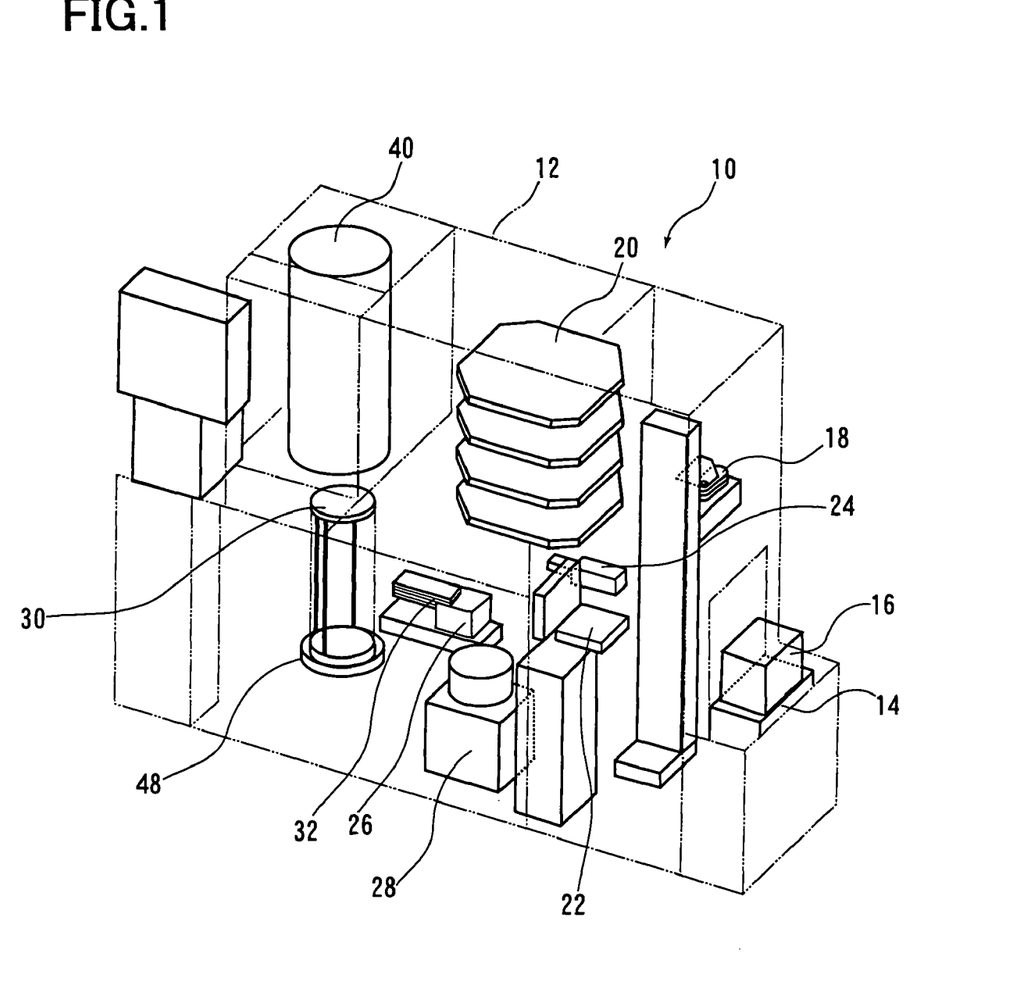
FIG. 1 is a perspective view showing a heat treatment apparatus used in an embodiment of the present invention.

An example of a substrate treatment apparatus 10 according to the embodiment of the invention is shown in FIG. 1. This substrate treatment apparatus 10 is a batch-type vertical heat treatment apparatus and has a box 12 having a main part disposed therein. A pod stage 14 is connected to the front side of this box 12 and a pod 16 is transported to this pod stage 14. The pod 16 houses twenty five substrates, for example, and is set on the pod stage 14 with a lid (not shown) closed.

A pod transport unit 18 is disposed at a position opposite to the pod stage 14 on the front side in the box 12. Moreover, a pod shelf 20, a pod opener 22, and a number-of-substrates detector 24 are disposed near this pod transport unit 18. The pod shelf 20 is disposed above the pod opener 22 and the number-of-substrates detector 24 is disposed next to the pod opener 22. The pod transport unit 18 transports the pod 16 between the pod stage 14, the pod shelf 20, and the pod opener 22. The pod opener 22 opens the lid of the pod 16 and the number of substrates in the pod 16 the lid of which is opened is detected by the number-of-substrates detector 24.

Further, a substrate transfer unit 26, a notch aligner 28, and a substrate support jig 30 (boat) are disposed in the box 12. The substrate transfer unit 26 has an arm (tweezers) 32 capable of taking out five substrates, for example, and transports the substrate between the pod 16 placed at the position of the pod opener 22, the notch aligner 28, and the substrate support jig 30 by moving this arm 32. The notch aligner 28 detects notches or orientation flats formed in the substrates and aligns the notches or orientation flats of the substrates at a specified position.

Still further, a reaction furnace 40 is disposed in an upper portion on a back side in the box 12. The substrate support jig 30 charged with plural substrates is carried into this reaction furnace 40 and heat treatment is performed.

Figure 2:
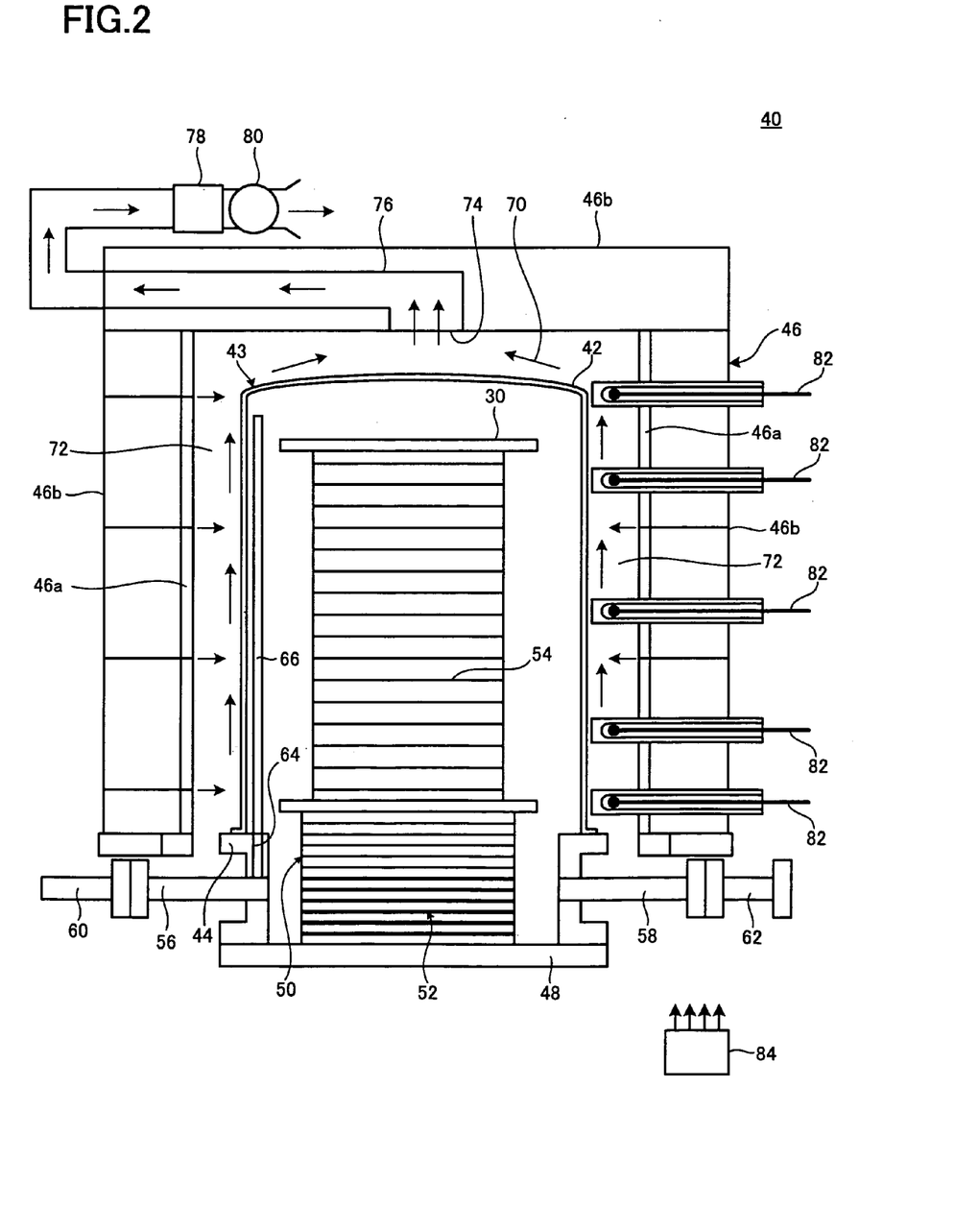
FIG. 2 is a longitudinal sectional view showing a reaction furnace used in the embodiment of the present invention.

An example of the reaction furnace 40 is shown in FIG. 2. This reaction furnace 40 has a reaction tube 42 made of silicon carbide (SiC). This reaction tube 42 is formed in the shape of a cylinder having a top end portion closed and having a bottom end portion opened and the opened bottom end portion is shaped like a flange. An adapter 44 made of quartz is disposed below this reaction tube 42 so as to support the reaction tube 42. This adapter 44 is formed in the shape of a cylinder having top and bottom end portions opened and the opened top and bottom end portions are shaped like flanges. The bottom surface of the bottom end flange of the reaction tube 42 abuts against the top surface of the top end flange of the adapter 44. A reaction container 43 is formed of the reaction tube 42 and the adapter 44. Moreover, a heater 46 for heating the substrates in the reaction tube 42 is disposed around the reaction tube 42 except for the adapter 44 of the reaction container 43.

The bottom of the reaction container 43 formed of the reaction tube 42 and the adapter 44 is opened so as to have the substrate support jig 30 inserted thereinto and this opened portion (furnace mouth) is hermetically closed by abutting a furnace mouth seal cap 48 against the bottom surface of the bottom end flange of the adapter 44 with an O ring interposed between them. The furnace mouth seal cap 48 is disposed in such a way as to support the substrate support jig 30 and to be able to move up and down. A first heat insulating material 52 made of quartz and a second heat insulating material 50 made of silicon carbide (SiC) are interposed between the furnace mouth seal cap 48 and the substrate support jig 30, the second heat insulating material 50 being disposed on the first heat insulating material 52. The substrate support jig 30 supports many substrates 54, for example, 25 to 100 substrates in many layers in a horizontal state with a clearance between the substrates and is charged into the reaction tube 42.

The reaction tube 42 is made of silicon carbide (SiC) so as to enable the substrate to be treated at a high temperature of 1200° C. or more. If the reaction tube 42 made of SiC is extended to the furnace mouth and this furnace mouth is structured so as to be sealed by the furnace mouth seal cap 48 via the O ring, there is a possibility that that reaction tube 42 might be brought to high temperature to its seal portion by heat transferred via the reaction tube 42 made of SiC to melt the O ring of a seal material. When the reaction tube 42 made of SiC has its seal portion cooled so as not to melt the O ring, the reaction tube 42 made of SiC will be broken by a thermal expansion difference caused by a temperature difference. Thus, of the reaction container 43, a portion heated by the heater 46 is constructed of the reaction tube 42 made of SiC and other portion separate from the portion heated by the heater 46 is constructed of the adapter 44 made of quartz. This construction can relax heat transfer from the reaction tube made of SiC and can seal the furnace mouth without melting the O ring and breaking the reaction tube 42. Moreover, as for the sealing of the reaction tube 42 made of SiC and the adapter 44 made of quartz, if the surfaces of both of them are finished with high accuracy, because the reaction tube 42 is disposed near the heating area of the heater 46, the reaction tube 42 made of SiC does not cause a temperature difference and hence is expanded thermally isotropically. Thus, the flange portion of the bottom end of the reaction tube 42 made of SiC can keep a flat plane and hence does not develop a clearance between the reaction tube 42 and the adapter 44. Hence, a sealing capability can be secured only by placing the reaction tube 42 made of SiC on the adapter 44 made of quartz.

A gas supply port 56 and a gas exhaust port 58 are formed integrally with the adapter 44 in the adapter 44. A gas introduction tube 60 is connected to the gas supply port 56 and an exhaust tube 62 is connected to the gas exhaust port 58, respectively. The inner wall of the adapter 44 is inside (is protruded from) the inner wall of the reaction tube 42 and a gas introduction passage 64 communicating with the gas supply port 56 and directing in a vertical direction is formed in the side wall portion (thick portion) of the adapter 44 and a nozzle holding hole is formed in the top of the side wall portion so as to open upward. This nozzle holding hole opens in the top surface on the top end flange side of the adapter 44 in the reaction tube 42 and communicates with the gas supply port 56 and the gas introduction passage 64. A nozzle 66 is inserted into and fixed in this nozzle holding hole. In other words, the nozzle 66 is connected to the top surface of a portion protruding inside from the inner wall of the reaction tube 42 of the adapter 44 in the reaction tube 42 and the nozzle 66 is held by the top surface of this adapter 44. With this construction, a nozzle connection portion cannot be easily deformed and broken by heat. Moreover, this construction also produces the merit of facilitating assembling and disassembling the nozzle 66 and the adapter 44. A treatment gas introduced into the gas supply port 56 from the gas introduction tube 60 is supplied into the reaction tube 42 through the gas introduction passage 64 formed in the side wall portion of the adapter 44 and through the nozzle 66. The nozzle 66 is constructed so as to extend to a portion upper than a top end in an area where the substrates are disposed (upper than the top end of the substrate support jig 30) along the inner wall of the reaction tube 42.

Moreover, the above-mentioned heater 46 is constructed of a heater wire 46a and a thermal insulating material 46b. The thermal insulating material 46b of the heater 46 is disposed on the top and the side of the reaction furnace 40 and the heater wire 46a is disposed inside the thermal insulating material 46b disposed on the side of the reaction furnace 40. The heater 46 is divided into plural zones, for example, five zones. Moreover, the heater 46 disposed on the side of the reaction furnace 40 is provided with cooling air intake ports 46c (shown in FIG. 3). These cooling-air intake ports 46c communicate with a cooling air supply source (not shown) and a cooling air channel 72 to be described later and are formed a specified number so as to be uniformly distributed. In this regard, instead of providing the cooling air source, atmosphere around the reaction furnace 40 may be sucked by a blower 80 disposed above the reaction furnace 40 and to be described later.

Moreover, a channel for circulating cooling fluid is disposed outside the reaction tube 42. Specifically, a cooling air channel 72 for circulating cooling air 70 as cooling fluid is formed between the reaction tube 42 and the heater 46 so as to surround the entire reaction tube 42. Here, as for the cooling fluid, in addition to air, nitrogen ($N_2$) may be used. Moreover, an exhaust port 74 for exhausting the cooling air 70 from the cooling air channel 72 is formed in the center of the thermal insulating material 46b disposed on the top of the reaction furnace 40 and this exhaust port 74 communicates with an exhaust passage 76. Further, a radiator (heat exchanger) 78 and the blower 80 are disposed in the downstream direction of the exhaust passage 76. The cooling air 70 flows through the cooling air intake ports 46c, the cooling air channel 72, the exhaust port 74, and the exhaust passage 76 and has its heat removed by the radiator 78 and then is exhausted by the blower 80. In this manner, the cooling air channel 72 is constructed in such a way that the cooling air 70 flows in parallel on the outside surface of the reaction furnace 42.

Plural (for example, five) thermocouples 82 for detecting temperature around the reaction tube 42 are disposed in the cooling air channel 72 of the above-described reaction furnace 40. Specifically, these thermocouples 82 are disposed at plural (for example, five) positions in the vertical direction so as to respond to the respective heater zones and detect the temperature of atmosphere near the outer wall of the reaction tube 42. These thermocouples 82 are inserted into the reaction furnace 40 from outside the heater 46 (heater wire 46a and thermal insulating material 46b) so as to pass through the heater 46 and their tips (temperature measuring contact points (thermal contact points) of temperature detection portions) are disposed near the outer wall of the reaction tube 42.

Furthermore, the substrate treatment apparatus 10 is provided with a control unit 84. The above-described heater 46 (heater wire 46a) and the thermocouples 82 are connected to this control unit 84, respectively. The thermocouples 82 transmit temperature detection results to the control unit 84 and the control unit 84 feedback controls the heater 46 by the temperatures detected by these thermocouples 82. That is, the control unit 84 finds differences between the target temperature of the heater 46 and the temperatures detected by the thermocouples 82. When there are differences, the control unit 84 performs feedback control to cancel the differences.

In addition to this control, the control unit 84 controls also the operations of the parts constructing the substrate treatment apparatus.

Next, the operation of the substrate treatment apparatus 10 constructed in the above-mentioned manner, that is, a method for treating a substrate as one process of a process for manufacturing a substrate or a process for manufacturing a semiconductor device by the use of the above-described substrate treatment apparatus 10 will be described.

Here, in the following description, the operations of the respective parts constructing the substrate treatment apparatus 10 are controlled by the control unit 84.

First, when the pod 16 having plural pieces of substrates 54 housed therein is set on the pod stage 14, the pod transport unit 18 transports the pod 16 from the pod stage 14 to the pod shelf 20 and stocks the pod 16 on this pod shelf 20. Next, the pod transport unit 18 transports the pod 16 stocked on this pod shelf 20 to the pod opener 22 and sets the pod 16 there. This pod opener 22 opens the lid of the pod 16 and the number-of-substrates detector 24 detects the number of the substrates 54 housed in the pod 16.

Next, the substrate transfer unit 26 takes the substrates 54 out of the pod 16 at the position of the pod opener 22 and transfers the substrates 54 to the notch aligner 28. This notch aligner 28 detects notches while rotating the substrates 54 and aligns the notches of plural pieces of substrates 54 at the same position on the basis of the detected information. Next, the substrate transfer unit 26 takes the substrates 54 out of the notch aligner 28 and transfers the substrates 54 to the substrate support jig 30 (substrate transfer process).

When one batch of substrates are transferred to the substrate support jig 30 in this manner, the substrate support jig 30 having the plural substrates 54 charged therein is carried into the reaction furnace 40 (reaction container 43) set at about 600° C., for example, and then the reaction furnace 40 is hermetically closed by the furnace mouth seal cap 48 (substrate transport process). Next, a furnace temperature is raised to a heat treatment temperature (temperature raising process) and then a treatment gas is introduced into the reaction tube 42 from the gas introduction tube 60 through the gas introduction port 56, the gas introduction passage 64 formed in the side wall portion of the adapter 44, and the nozzle 66. The treatment gas contains nitrogen ($N_2$), argon (Ar), hydrogen ($H_2$), oxygen ($O_2$), hydrogen chloride (HCL), and dichloroethylene ($C_2H_2CL_2$, abbreviation DCE). When the substrates 54 are heat-treated, the substrates are heated to a treatment temperature of 1200° C. or more, for example (substrate treatment process).

When the heat treatment of the substrates 54 is finished, for example, the furnace temperature is lowered from the treatment temperature to a temperature of about 600° C. When this furnace temperature is lowered, for example, when the interior of the furnace is rapidly cooled, the cooling air 70 is supplied to the cooling air channel 72 from the cooling air supply source (not shown) through the cooling air intake ports 46c, and is passed through the exhaust port 74 and the exhaust passage 76 and has its heat removed by the radiator 78 and then is exhausted to the outside of the furnace by the blower 80. Here, when the cooling air supply source is not provided, by sucking atmosphere around the reaction tube 42 by the blower 80, air outside the reaction furnace 40 is taken into the cooling air channel 72 through the cooling air intake ports 46c and is passed through the exhaust port 74 and the exhaust passage 76 and has its heat removed by the radiator 78 and then is exhausted to the outside of the furnace by the blower 80. In other words, the interior of the reaction furnace 40, that is, the interior of the reaction tube 42 is rapidly cooled by developing the flow of wind (cooling air 70) around the reaction tube 42. At this time, the temperature in the reaction tube 42 is lowered while temperature around the reaction tube 42 is detected by the thermocouples 82 each covered by a protection tube 82 described later (temperature lowering process).

After the furnace temperature is lowered, the substrate support jig 30 supporting the substrates 54 subjected to the heat treatment is carried out of the reaction furnace 40 (substrate carrying-out process) and then the substrate support jig 30 is made standby at a specified position until all of the substrates 54 supported by the substrate support jig 30 are cooled (substrate cooling process). Next, when the substrates 54 in the substrate support jig 30 made standby are cooled to a specified temperature, the substrate transfer unit 26 takes the substrates 54 out of the substrate support jig 30 and transfers the substrates 54 to a vacant pod 16 set on the pod opener 22 and houses the substrates 54 in the pod 16 (substrate recovering process). Next, the pod transport unit 18 transports the pod 16 in which the substrates 54 are housed to the pod shelf 20 or the pod stage 14. This is the end of a series of treatments.

Figure 3:
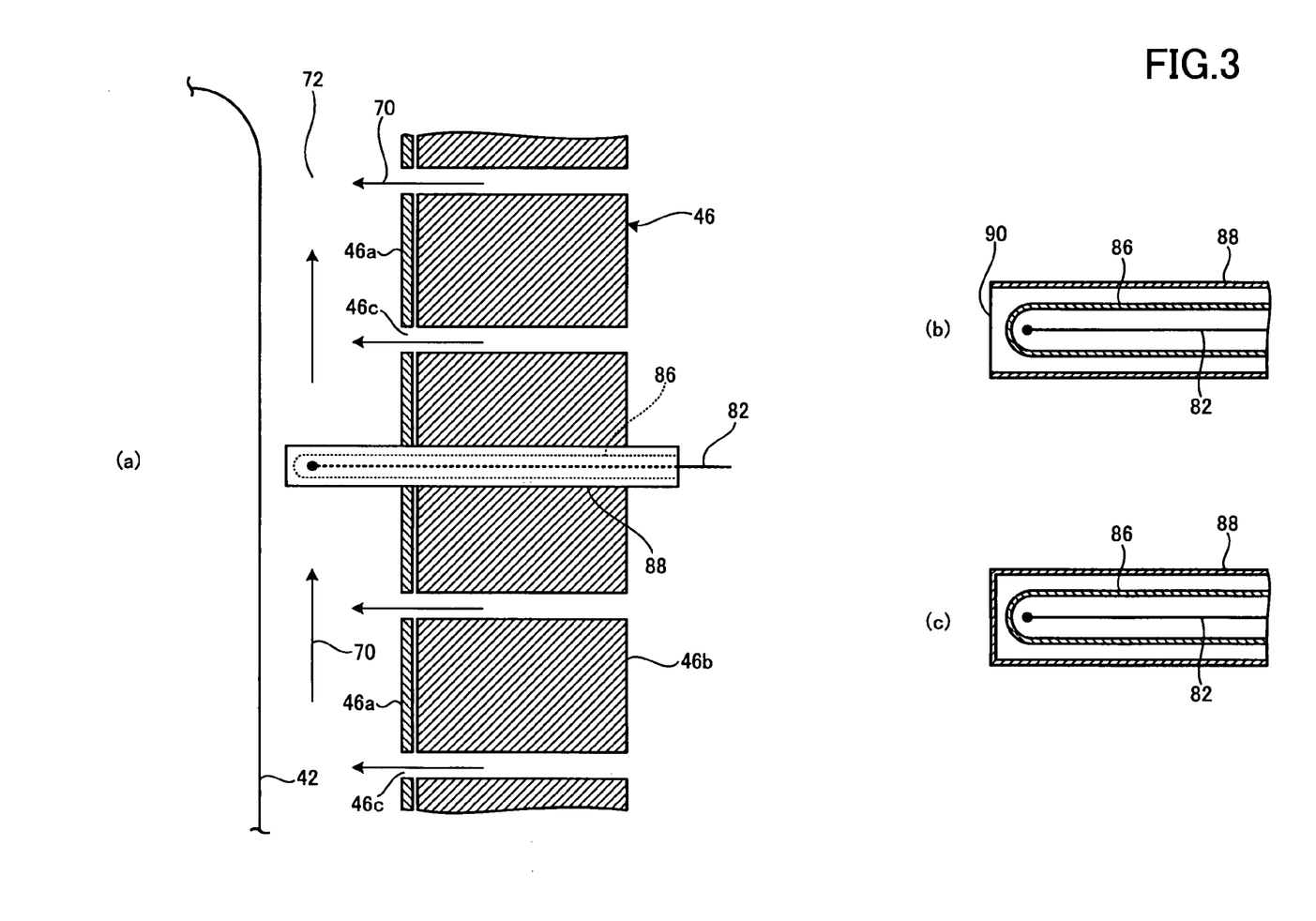
FIG. 3 show a thermocouple, a protection tube, and a cover member used in the embodiment of the present invention.

Next, the above-mentioned thermocouple 82 will be described in detail with reference to FIG. 3. For the sake of convenience, only one of the plural thermocouples 82 is shown in FIG. 3(a). As shown in FIG. 3(a), the thermocouple 82 is disposed in the cooling air channel 72 through which the cooling air 70 is circulated in a state where the thermocouple 82 is covered with a protection tube 86 This protection tube 86 is made of alumina ($Al_2O_3$) and is formed in the shape of a cylinder having a top end closed and having a rear end opened and is disposed in such a way that its tube axis is at a nearly right angle to the tube axis of the reaction tube 42.

Moreover, a cover member 88 is disposed outside the protection tube 86. This cover member 88 is made of alumina, for example, and is constructed so as to cover at least the whole side surface of the protection tube 86. The cover member is formed in the shape of a cylinder having a diameter larger than the protection tube 86, so a space is formed between the protection tube 86 and the cover member 88. With this construction, a gas (air) layer is formed between the protection tube 86 and the cover member 88.

As shown in FIG. 3(b), the tip end of the cover member is opened (tip opening type). In other words, the cover member 88 has an opening 90 at the tip end and this opening is formed so as to direct in a direction perpendicular to the flow of cooling fluid flowing through the above-described cooling air channel 72, that is, the flow of the cooling air 70. The cover member 88 is disposed in such a way that the opening 90 is opposite to the outside surface of the reaction tube 42. Moreover, the tip end of the protection tube 86 in which the temperature measuring contact point of the thermocouple 82 is exposed in the opening 90 and the protection tube 86 is disposed in such a way that the exposed tip end is opposite to the outside surface of the reaction tube 42.

The thermocouple 82, the protection tube 86, the cover member 88 are disposed in a channel for circulating the cooling fluid (cooling air 70), that is, in the cooling air channel 72 and the cover member 88 is constructed so as to intercept the flow toward the protection tube 86 of the cooling air 70. Thus, the protection tube 86 is disposed in such a way that its axis is at a nearly right angle to the tube axis of the reaction tube 42, that is, its tube axis is horizontal.

Moreover, as shown in FIG. 3(c), the cover member 88 may be formed in the shape not having the opening 90 at the tip end of the cover member 88, that is, having its tip end closed (tip closing type).

Figure 4:
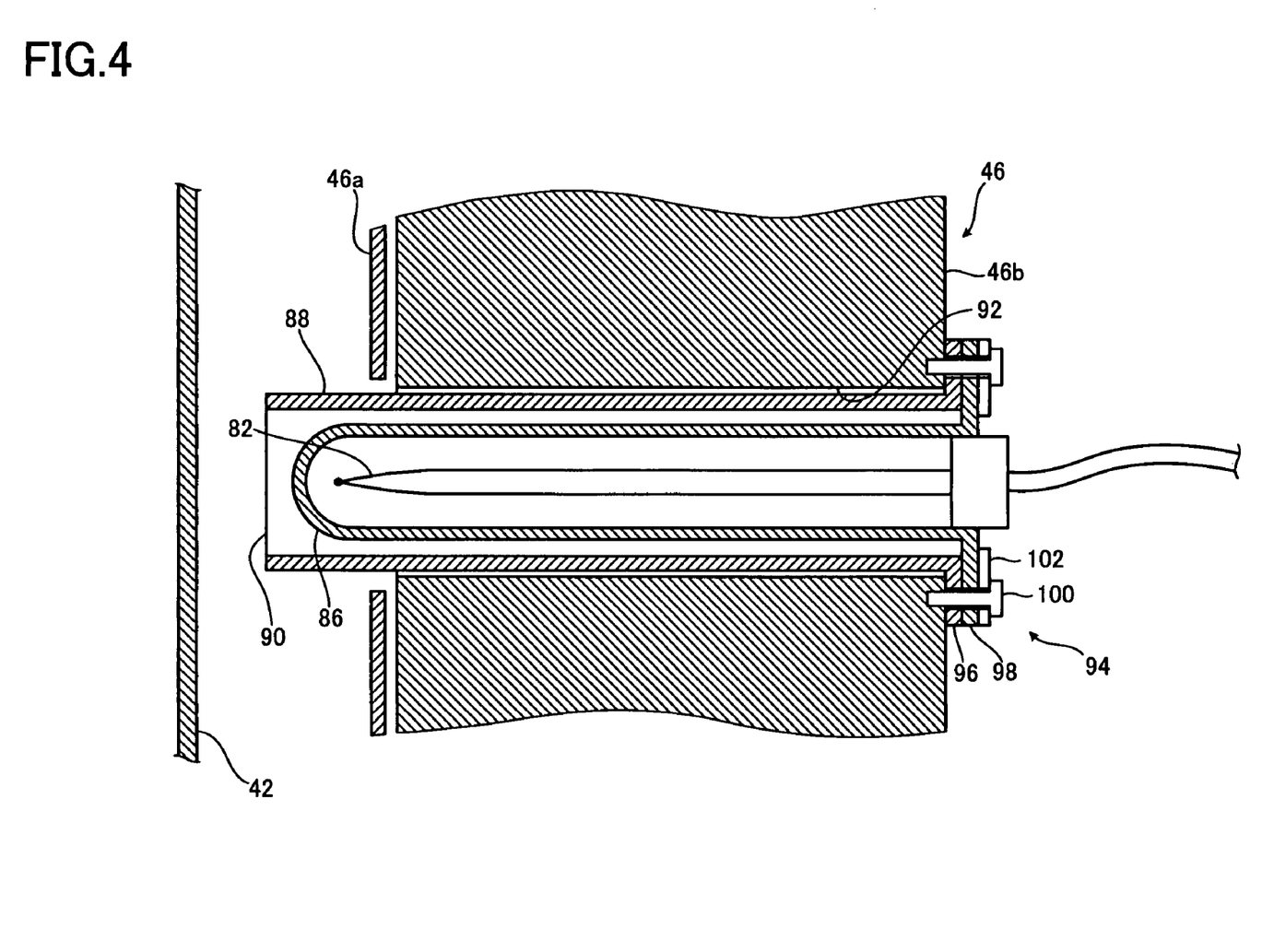
FIG. 4 is a sectional view showing the structure of mounting the thermocouple, the protection tube, and the cover member used in the embodiment of the present invention.

In FIG. 4 is shown the mounting structure of the thermocouple 82, the protection tube 86, and the cover member 88 in the tip opening type.

As shown in FIG. 4, a hole 92 through which the cover member 88 is passed is formed in the side wall of the thermal insulating material 46b. A collar portion (flange portion) 96 is formed at the root portion 94, that is, the end portion opposite to the tip end having the opening 90 formed therein of the cover member 88. This collar portion 96 is arranged so as to abut against the outer wall of the thermal insulating member 46b when the cover member 88 is inserted into the hole 92 of the thermal insulating material 46b from outside the thermal insulating material 46b and is set at a specified position. Moreover, a collar portion (flange portion) 98 is formed also at the root portion of the protection tube 86. This collar portion (flange portion) 98 is arranged so as to abut against the collar portion 98 of the cover member 88 when the protection tube 86 is inserted into the cover member 88 and is set at a specified position. Through holes through which fixtures 100 such as bolts are passed are formed in the collar portion 96 of the cover member 88 and in the collar portion 98 of the protection tube 86. These cover member 88 and the protection tube 86 are fixed to each other by the fixtures 100 via a fixing plate 102. Here, the thermocouple (wire of thermocouple) 82 is fixed to the protection tube 86 at the root portion of the protection tube 86.

In this manner, the cover member 88 is disposed outside the protection tube 86 so as to intercept the flow toward the protection tube 86 of the cooling air 70, so the effect of the cooling air 70 can be reduced. In other words, by covering the protection tube 86 with the cover member, 88, it is possible to prevent the protection tube 86 from directly receiving the flow of the cooling air 70 circulating through the cooling air channel 72 (to prevent wind caused by the flow of the cooling air 70 from directly colliding with the protection tube 86). Moreover, by disposing the cover member 88 made of alumina, for example, it is possible to increase the heat capacity of the thermocouple 82 (and the protection tube 86). With this, it is possible to prevent the temperature of the thermocouple 82 (and the protection tube 86) from being lowered faster than the temperature in the reaction tube 42. Thus, by controlling temperature in the reaction tube 42 with the protection tube 86 provided with the cover member 88, it is possible to improve the responsivity of the thermocouple 82 even in the event of a large temperature change rate, for example, even when the interior of the furnace is rapidly cooled. Hence, it is possible to control the temperature in the reaction tube 42 with accuracy.

Further, the air layer formed between the protection tube 86 and the cover member 88 becomes a thermal insulating layer and produces a thermal insulating effect. In other word, this air layer can prevent heat in the furnace from being transmitted to the thermocouple 82 and the protection tube 86 and to their root portions, thereby preventing heat from being dissipated from the furnace and hence can prevent a decrease in temperature in the furnace at the time of raising the temperature or at the time of stabilizing the temperature and a decrease in temperature detected by the thermocouple 82. Furthermore, when the shape of the cover member 88 is of the tip closing type, the flow of air in this thermal insulating layer is small and hence a higher thermal insulating effect can be produced.

Still further, when the shape of the cover member 88 is of the tip opening type, the tip end of the cover member 88 is opened and is close to the reaction tube 42 and the side surface other than the tip end is covered with the cover member, so the cover member 88 can intercept the flow toward the protection tube 86 of the cooling air 70 and can transmit radiant heat and heat by heat transfer from the reaction tube 42 (heat by heat transfer to the air outside the reaction tube 42 from the reaction tube 42) to the thermocouple 82 more appropriately, so a difference between the temperature in the reaction tube 42 and the temperature detected by the thermocouple 82 can be reduced. In other words, the cover member 88 can improve the responsivity of the thermocouple 82 to the temperature in the reaction tube 42.

Still further, by providing the protection tube 86 with the cover member 88, it is possible to protect the thermocouple 82 and the protection tube 86 and to prevent the root portion and the body portion of the thermocouple 82 from being broken. Thus, it is possible to improve the safety and life of the thermocouple 82.

Figure 5:
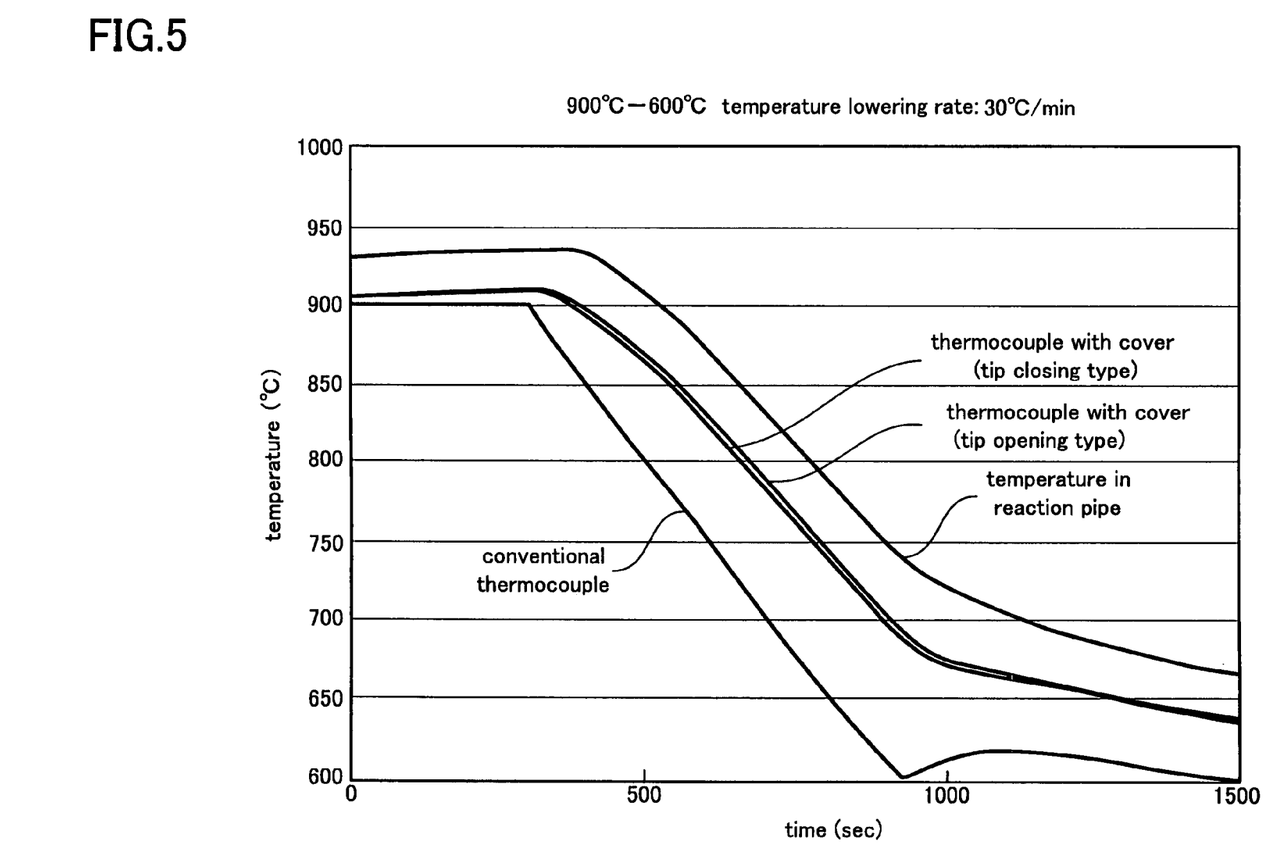
FIG. 5 is a graph showing measured temperature in the furnace at the time of lowering temperature and the responsivity of respective thermocouples (conventional type, with a cover member (tip opening type, tip closing type)) to temperature in a reaction tube.

Next, the responsivity of the thermocouple provided with the cover member in this embodiment will be described on the basis of the following experiment results (FIG. 5).

FIG. 5 is a graph showing measured temperatures in the furnace at the time of lowering temperature and expressing the responsivity of the respective thermocouples (to be described later) to temperature in the reaction tube.

A thermocouple was placed on a substrate in a reaction tube and temperature in the reaction tube was measured (temperature in the reaction tube in FIG. 5). Moreover, a thermocouple with a protection tube (conventional type), a thermocouple with a protection tube and a cover member (tip opening type), a thermocouple with a protection tube and a cover member (tip closing type) were set around the reaction tube and temperature around the reaction tube was measured.

The temperature of a heater was controlled by a conventional thermocouple set around the reaction tube and a temperature lowering test was performed on the condition of a temperature lowering rate of 30° C./min from 900° C. to 600° C.

As shown in FIG. 5, temperature in the reaction tube shows temperature higher than a control temperature (conventional thermocouple). Moreover, the thermocouple with the cover member of the tip opening type and the thermocouple with the cover member of the tip closing type show temperatures higher than the control temperature (conventional thermocouple) although they have a certain temperature difference with respect to the temperature in the reaction tube. On the other hand, it can be thought that because the conventional thermocouple receives the flow of the cooling air, the conventional thermocouple shows the lowest temperature. In other words, the thermocouples with the cover members (tip opening type and tip closing type) show temperatures closer to the temperature in the reaction tube than the conventional thermocouple. From this fact, it can be found that when the temperature around the reaction tube is detected by the thermocouple with the cover member, that is, in a state where the flow toward the protection tube of the cooling air is intercepted, the effect of the cooling air is reduced.

Moreover, the thermocouple with the cover member of the tip opening type shows temperature closer to the temperature in the reaction tube than the thermocouple with the cover member of the tip closing type. From this result, it can be found that the cover member of the top opening type has better responsivity to the temperature in the reaction tube than the cover member with the top closing type.

In this regard, as for the material of the cover member 88, in addition to alumina ($Al_2O_3$), for example, zirconia ($ZrO_2$) and silicon carbide (SiC) can be used. Further, when a place where the cover member 88 is disposed is at a certain level of low temperature (for example, 1000° C. or less), silicon oxide (SiO$_2$) can be also used as the material of the cover member 88.

Next, a first modification of the present invention will be described with reference to FIGS. 6(*a*) to 6(*c*).

Figure 6:
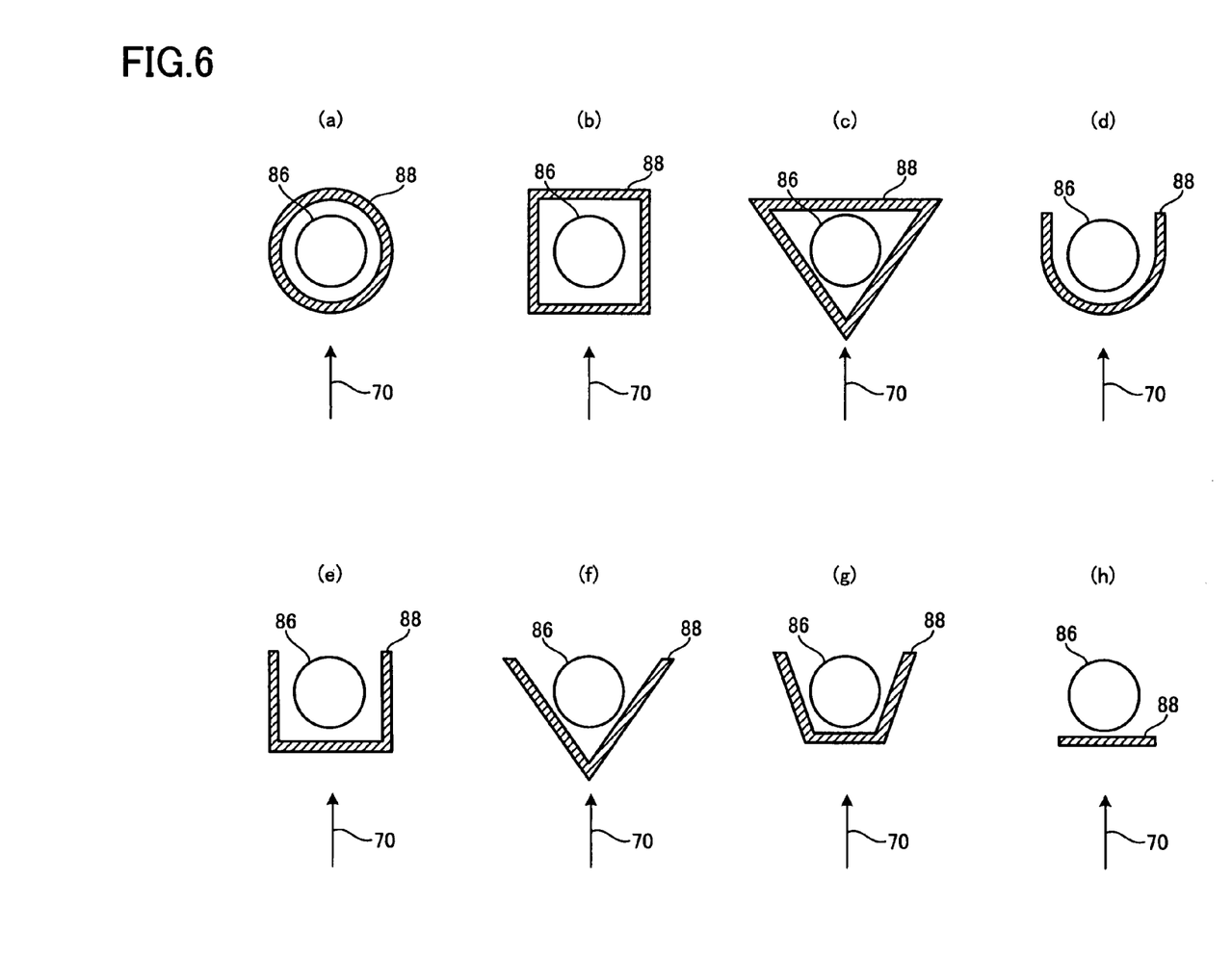
FIG. 6 show a first modification and a second modification in the embodiment of the present invention.

The sectional shape of the cover member 88 in the first modification of the present invention, as shown in FIG. 6(*a*) to 6(*c*), is circular, rectangular and triangular. In this manner, the sectional shape of the cover member 88 may be polygonal, for example, rectangular and triangular, if the cover member 88 covers the whole side surface of the protection tube 86.

Next, a second modification of the present invention will be described with reference to FIGS. 6(*d*) to 6(*h*).

The sectional shape of the cover member 88 in the second modification of the present invention, as shown in FIG. 6(*d*) to 6(*h*), is formed in a shape that covers only the lower portion of the side surface of the protection tube 86, the lower portion directly receiving the flow of the cooling air 70, in other words, in a shape that opens at least a part of the upper portion of the protection tube 86, the upper portion being opposite to a side directly receiving the flow of the cooling air 70. For example, in the shape shown in FIG. 6(*d*) to 6(*g*), the cover member 88 is formed in a shape that covers the bottom and side portions of the protection tube 86. Moreover, in the shape shown in FIG. 6(*h*), the cover member 88 is formed in a shape that covers only the bottom portion of the protection tube 86. In this manner, the cover member 88 may be also constructed so as to cover at least a part of the side surface of the protection tube 86. Even if the cover member 88 is formed in the shape like this, it is possible to prevent the flow of the cooling air 70 from directly colliding with the protection tube 86.

In this regard, the shapes shown in FIGS. 6(*d*) to 6(*g*) that cover the bottom and side portions of the protection tube 86 can further prevent the effect of the cooling air 70 entering the protection tube 86 from an open portion than the shape shown in FIG. 6(*h*) that covers only the bottom portion of the protection tube 86. Here, the shape that covers the whole side surface of the protection tube 86 (for example, the shape of the above embodiment and the shapes shown in FIGS. 6(*a*) to 6(*c*) of the first modification) can eliminate the effect of the cooling air 70 entering the protection tube 86 from the side surface of the protection tube 86. Moreover, the shapes shown in FIGS. 6(*d*) to 6(*g*) that cover the bottom and side portions of the protection tube 86 can produce a larger thermal insulating effect than the shape shown in FIG. 6(*h*) that covers only the bottom portion of the protection tube 86. Furthermore, the shapes shown in FIGS. 6(*a*) to 6(*c*) that cover the whole side surface of the protection tube 86 can produce a larger thermal insulating effect than the shapes shown in FIG. 6(*d*) to 6(*g*) that cover the bottom and side portions of the protection tube 86.

The first modification and the second modification can be applied both of the tip opening type and the tip closing type.

Figure 7:
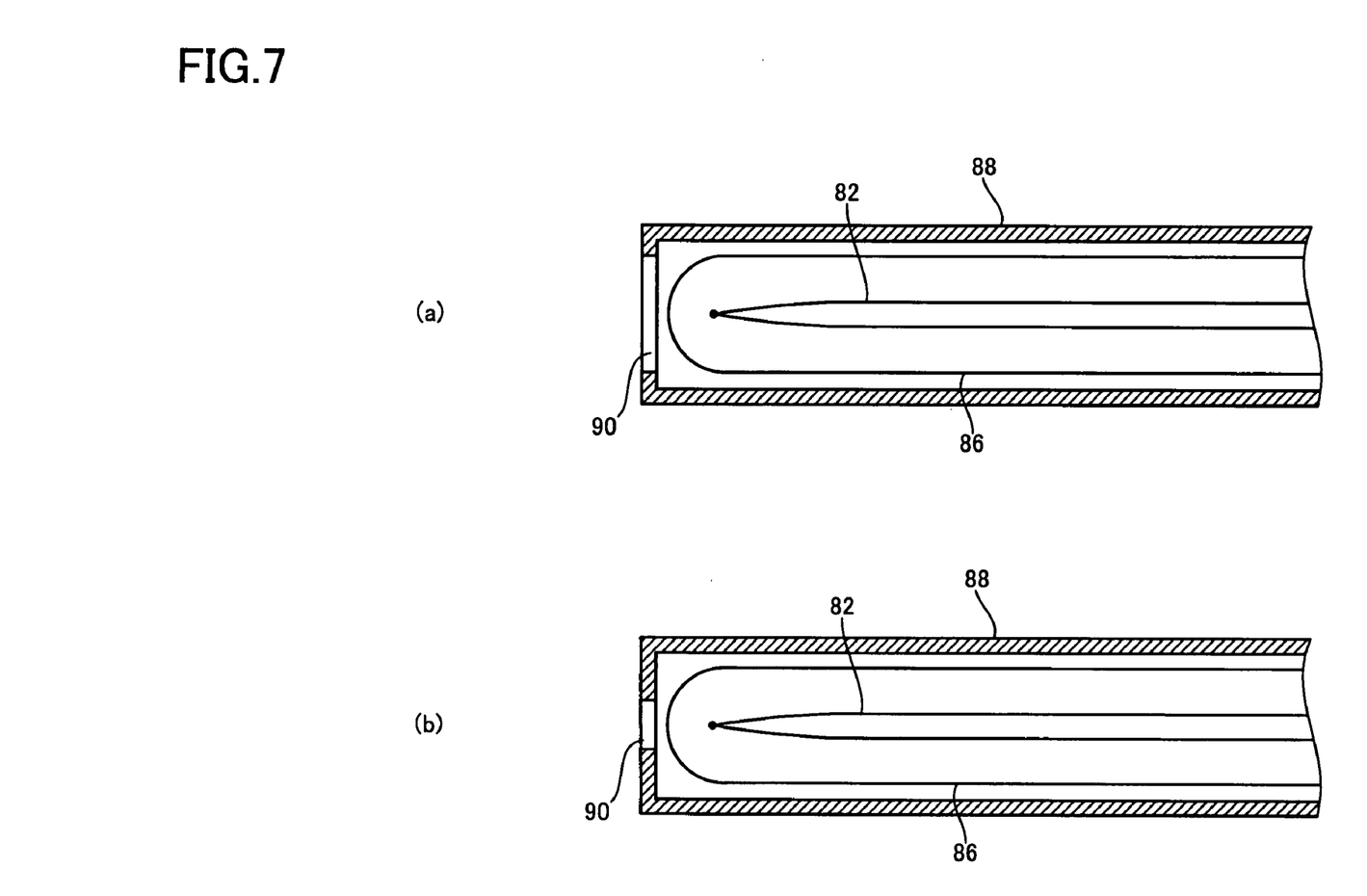
FIG. 7 show a third modification in the embodiment of the present invention.

Next, a third modification of the present investigation will be described with reference to FIG. 7. The third modification is an improvement of the cover member of the tip opening type. The diameter of the opening 90 of the cover member 88 in the third modification of the present invention is nearly equal to the diameter of the protection tube 86 as shown in FIG. 7(*a*), or smaller than the diameter of the protection tube 86 as shown in FIG. 7(*b*). In this manner, the diameter of the opening 90 may be close to the diameter of the protection tube 86 (nearly equal to the diameter of the protection tube 86), or may be smaller than the diameter of the protection tube 86. This can prevent the cooling air 70 from entering through the opening 90. Thus, it is possible to take advantage of the cover member 88 of the tip opening type and to further resist being affected by the cooling air 70 and to produce a larger thermal insulating effect.

In this regard, the shape shown in FIG. 7(*b*) can further prevent the effect of the cooling air 70 entering the protection tube 86 from the opening 90 than the shape shown in FIG. 7(*a*).

Here, in the description of the embodiments, a batch type heat treatment apparatus for heat-treating plural substrates is used as the heat treatment apparatus. However, it is not intended to limit the heat treatment apparatus to the batch type heat treatment apparatus but a single substrate processing type heat treatment apparatus may be used.

The present invention can be applied to one process of a process for manufacturing an SIMOX (Separation by Implanted Oxygen) wafer that is a kind of SOI (Silicon On Insulator) wafer.

That is, in the SIMOX wafer, first, oxygen ions are ion-implanted into a single crystal silicon wafer by an ion implantation apparatus or the like. Then, the wafer having oxygen ions implanted therein is annealed at a high temperature of 1300° C. to 1400° C., for example, 1350° C. or more in the atmosphere of Ar, O$_2$, for example, by the use of the heat treatment apparatus described above in the embodiments. With these treatments, an SIMOX wafer having an SiO$_2$ layer formed therein (having an SiO$_2$ layer embedded) is manufactured.

Further, the present invention can be also applied to one process of a process for manufacturing a hydrogen-annealed wafer, in addition to the SIMOX wafer. In this case, a wafer is annealed at a high temperature of about 1200° C. or more in the atmosphere of hydrogen by the use of the heat treatment apparatus of the present invention. This can reduce crystal defects in a wafer surface layer on which an IC (integrated circuit) is to be formed and hence can enhance the perfectibility of the crystal.

Still further, in addition to these, the present invention can be also applied to one process of a process for manufacturing an epitaxial wafer.

Even in the case of performing the above-mentioned high-temperature annealing treatment as one process of a process for manufacturing a substrate, by using the present invention, the effect of cooling fluid can be reduced and hence temperature control in the reaction tube can be performed with accuracy.

The present invention can be applied also to a process for manufacturing a semiconductor device. It is preferable that the present invention is applied, in particular, to a heat treatment process performed at a comparatively high temperature such as a thermal oxidation process, for example, wet oxidation, dry oxidation, hydrogen burning oxidation (pyrogenic oxidation), and HCL oxidation, and a thermal diffusion process for diffusing impurities (dopant) such as boron (B), phosphor (P), arsenic (As), and antimony (Sb) into a semiconductor thin film.

Also in the case of performing a heat treatment process as one process of a process for manufacturing a semiconductor device like this, by using the present invention, the effect of the cooling fluid can be reduced and hence the temperature control in the reaction tube can be performed with accuracy.

The invention claimed is:
1. A substrate treatment apparatus comprising:
a reaction tube for treating a substrate;
a heater for heating the substrate in the reaction tube;
a channel for circulating cooling fluid outside the reaction tube;

a thermocouple for detecting temperature around the reaction tube, wherein the thermocouple is disposed in the channel for circulating cooling fluid in a state where the thermocouple is covered with a protection tube; and a cover for intercepting flow of the cooling fluid toward the protection tube is disposed outside the protection tube, wherein the cover has an opening formed in its tip end and is disposed in such a way that the opening is opposite to an outside surface of the reaction tube.

2. The substrate treatment apparatus according to claim 1, wherein a tip end of the protection tube where a temperature measuring contact point of the thermocouple is located is exposed in the opening, and wherein the protection tube is disposed in such a way that its exposed tip end is opposite to the outside surface of the reaction tube.

3. The substrate treatment apparatus according to claim 2, constructed in such a way that the cooling fluid flows in parallel to the outside surface of the reaction tube.

4. The substrate treatment apparatus according to claim 3, wherein the protection tube is disposed in such a way that its tube axis is at a right angle to flow of the cooling fluid.

5. The substrate treatment apparatus according to claim 3, wherein the protection tube is disposed in such a way that its tube axis is at a right angle to a tube axis of the reaction tube.

6. The substrate treatment apparatus according to claim 3, wherein the protection tube is disposed in such a way that its tube axis is horizontal.

7. The substrate treatment apparatus according to claim 3, wherein a space is formed between the protection tube and the cover.

8. The substrate treatment apparatus according to claim 3, wherein the cover is constructed so as to cover at least a part of side surface of the protection tube.

9. The substrate treatment apparatus according to claim 3, wherein the cover is constructed so as to cover whole of side surface of the protection tube.

10. The substrate treatment apparatus according to claim 1, wherein the cover is made of alumina, zirconia, or silicon carbide.

11. A method for manufacturing a substrate comprising the steps of:

carrying a substrate into a reaction tube;

heating the substrate in the reaction tube to treat the substrate;

lowering temperature in the reaction tube after processing the substrate while circulating cooling fluid outside the reaction tube and detecting temperature around the reaction tube by a thermocouple disposed in a channel for circulating the cooling fluid and covered with a protection tube;

carrying the treated substrate out of the reaction tube; and disposing a cover outside the protection tube, wherein in the step of lowering temperature in the reaction tube, the temperature around the reaction tube is detected in a state where flow of the cooling fluid toward the protection tube is intercepted by the cover, and the cover has an opening formed in its tip end and is disposed in such a way that the opening is opposite to an outside surface of the reaction tube.

* * * * *